United States Patent [19]
Savir

[11] Patent Number: 5,642,362
[45] Date of Patent: Jun. 24, 1997

[54] SCAN-BASED DELAY TESTS HAVING ENHANCED TEST VECTOR PATTERN GENERATION

[75] Inventor: Jacob Savir, Mahopac, N.Y.

[73] Assignee: International Business Machines Corporation, Armonk, N.Y.

[21] Appl. No.: 277,716

[22] Filed: Jul. 20, 1994

[51] Int. Cl.$^6$ .................................................. G01R 31/28
[52] U.S. Cl. ..................... 371/22.3; 371/22.1; 371/22.5; 364/717
[58] Field of Search ........................... 371/22.3, 27, 22.1, 371/22.2, 22.5, 22.6; 324/73 R, 158 R, 73.1

[56] References Cited

U.S. PATENT DOCUMENTS

| | | | |
|---|---|---|---|
| 4,503,537 | 3/1985 | McAnney | 371/25 |
| 4,680,539 | 7/1987 | Tsai | 324/73 R |
| 4,687,988 | 8/1987 | Eichelberger et al. | 324/73 AT |
| 4,688,223 | 8/1987 | Motika et al. | 371/27 |
| 4,698,830 | 10/1987 | Barzilai et al. | 377/19 |
| 4,745,355 | 5/1988 | Eichelberger et al. | 324/73 R |
| 4,801,870 | 1/1989 | Eichelberger et al. | 324/73 R |
| 4,855,669 | 8/1989 | Mahoney | 324/73 R |
| 4,912,395 | 3/1990 | Sato et al. | 571/21.2 |
| 4,959,832 | 9/1990 | Bardell | 371/27 |
| 5,042,034 | 8/1991 | Correale, Jr. et al. | 371/22.3 |
| 5,130,988 | 7/1992 | Wilcox et al. | 371/22.3 |
| 5,150,366 | 9/1992 | Bardell, Jr. et al. | 371/22.3 |
| 5,278,842 | 1/1994 | Berry et al. | 371/22.3 |
| 5,297,151 | 3/1994 | Gruetzner et al. | 371/27 |
| 5,323,400 | 6/1994 | Agarwal et al. | 371/22.3 |

OTHER PUBLICATIONS

"Scan–Based Transition Test", by Jacob Savir and Srinivas Patil, IEEE Transactions on Computer–Aided Design of Integrated Circuits and Systems, vol. 12, No. 8, Aug. 1993, pp. 1232–1241.

"On broad–side delay test", by J. Savir and S. Patil, Proc. 1994 VLSI Test Symposium, pp. 284–290, Apr. 1994.

"Built In Test For VSLI: pseudorandom techniques", John Wiley, 1987., pp. 285–289 by P. Bardell, W. McAnney, and the J. Savir.

Primary Examiner—Robert W. Beausoliel, Jr.
Assistant Examiner—Nadeem Iqbal
Attorney, Agent, or Firm—Perman & Green, LLP

[57] ABSTRACT

This invention teaches circuitry and methods for performing delay tests, including skewed-load, broad-side, and STUMPS-related tests. More particularly a logic circuit (10), such as an integrated circuit, includes at least one block of combinational logic (12) having a plurality of input nodes and at least one output node. The logic circuit further includes delay test circuitry (14, 16, 18) that is coupled to the plurality of input nodes and to the at least one output node. The delay test circuitry has a scan-chain register (14) having a plurality of outputs coupled to the plurality of input nodes for establishing at least first and second multi-bit test vectors at the plurality of input nodes. The delay test circuitry further includes a plurality of XOR gates that are coupled to the scan-chain register. The plurality of XOR gates have outputs for establishing logic states of bits of the second test vector at the plurality of input nodes. In the skewed-load test the XOR gates overcome the one bit shift dependency problem, while in the broad-side and STUMPS test the XOR gates, in combination with one or more sources of random logic states, are used to introduce second vectors having optimal probabilities for launching transitions.

18 Claims, 4 Drawing Sheets

SCAN-BASED DELAY TESTS HAVING ENHANCED TEST VECTOR PATTERN GENERATION

FIELD OF THE INVENTION

This invention relates generally to logic delay test methodology and, in particular, to circuit design techniques and methods relating to skewed-load and broadside delay tests.

BACKGROUND OF THE INVENTION

Ascertaining the correct operation of digital logic circuits requires verification of functional behavior as well as correct operation at desired clock rates. Failures that cause logic to malfunction at desired clock rates are referred to as delay faults or as AC faults. These delay faults, particularly those occurring within integrated circuits, are typically due to random variations in process parameters that may cause device and/or wiring propagation delays to exceed specified limits. The detection of a delay fault normally requires the application of a two-pattern test: the first pattern applies an initialization value at the site of the suspected fault, and the second pattern provokes a logical transition at the site of the fault and propagates its effect to a primary output or latch. The two-pattern test will typically be structured to provoke a 0-to-1 transition at the site of the fault to test for a slow-to-rise (STR) fault, and will be structured to provoke a 1-to-0 transition to test for a slow-to-fall (STF) fault. By measuring the output of the circuit after a desired time interval it can be ascertained if a delay fault exists in the circuit.

As such, delay tests for logic circuits differ from static, stuck-at tests in that they characterize the dynamic properties of the circuit, such as the propagation delay. Two types of delay tests that are of most interest herein are the skewed-load test and the broad-side test.

Both of these delay tests employ a scan chain (by example, a scan chain based on a level sensitive scan design (LSSD)) for storing a logic initializing vector (V1) and for applying V1 to a circuit under test. The application of V1 is followed by the application of a second vector (V2) that launches at least one transition through the circuit under test. These two vectors may be referred to collectively as a delay test pair. The output of the circuit under test is subsequently sampled to determine if the transition has propagated through the circuit within some specified maximum propagation time. The skewed-load test and the broad-side test differ from one another primarily in how the second vector V2 is generated.

In the skewed-load transition test the second vector V2 of the delay test pair is a one bit shift from the first vector V1 of the pair. This type of delay test is useful for, by example, testing a block of combinational logic that is interposed between two scan chains. The first scan chain is used to apply the vectors and the second scan chain is used to latch the circuit outputs. In the skewed-load test protocol, in order not to disturb the logic initialized by the first vector of the delay test pair, the second vector of the pair (the vector V2 that launches the transition) is required to be a next (i.e., one bit-shift) pattern in the scan chain.

Although a skewed-load transition test is attractive from a timing point of view, there are various problems that may arise during its use. A problem of most concern herein is the limited number of second vectors that can be generated because of the constraint imposed by the logic state(s) of the first vector. In this regard reference can be had to an article entitled "Scan-Based Transition Test", by Jacob Savir and Srinivas Patil, IEEE Transactions on Computer-Aided Design of Integrated Circuits and Systems, Vol. 12, No. 8, August 1993, pp. 1232–1241.

By example, and referring to FIG. 1A, assume that a scan chain stores the following initializing vector:

0 0 1 0, and that the desired second vector is:

1 0 0 1.

For this case shifting in a one bit (from the left) results in the generation of the desired second vector, as shown in FIG. 1B. However, if the desired second vector is instead:

1 0 1 1, then the desired second vector cannot be generated. This is because the third bit (from the left) of the second vector is constrained to be a zero by the second bit of the initializing vector being a zero. That is, because of the one bit shift the third bit must assume the logic state of the second bit.

The broad-side delay test is also a form of the scan-based delay test where, as shown in FIGS. 2A and 2B, the first vector pattern is scanned into the chain, and the second vector of the delay pair is supplied through one or more blocks of combinational logic being tested. Both the launching of the transition and the capture of the resulting circuit response are accurately timed according to the system requirements. Since the first vector is applied through the scan chain and the second vector from the logic being tested, the broad-side delay test can be viewed as a semi-functional test that is run at speed. This approach is different from the skewed-load transition test, where both the first and second vectors of the delay test pair are applied by the scan hardware.

However, in many cases the broad-side delay test coverage is relatively low. This is due primarily to the limited potential of the broad-side approach to apply a rich set of two-pattern tests. That is, the total number of second vector patterns is constrained to the number of different patterns that can be generated by the logic under test. In this regard reference may be had to a second article by J. Savir and S. Patil, "On broad-side delay test," Proc. 1994 VLSI Test Symposium, pp. 284–290, April, 1994, for a detailed discussion of the broad-side test.

Reference is also made to commonly-assigned U.S. Pat. No. 5,278,842, entitled "Delay Test Coverage Enhancement for Logic Circuitry Employing Level Sensitive Scan Design", which was issued on Jan. 11, 1994 to Robert W. Berry, Jr. and to the inventor of the subject matter of this patent application. This patent discloses one approach to overcoming the foregoing problems that relate to shift-dependencies, wherein a number of adjacent latches of a chain of shift register latches provide signals to different cones of logic. A 'cone of logic' is considered to be associated with an output signal line of a logic circuit and those signal paths through which input signals influence the output signal.

The following commonly assigned U.S. Patents are all related to scan-based logic circuits and/or to the testing of logic circuits: U.S. Pat. No. 4,503,537, issued Mar. 5, 1985, entitled "Parallel Path Self-Testing System", to McAnney; U.S. Pat. No. 4,680,539, issued Jul. 14, 1987, entitled "General Linear Shift Register", to Tsai; U.S. Pat. No. 4,687,988, issued Aug. 18, 1987, entitled "Weighted Random Pattern Testing Apparatus And Method", to Eichelberger et al.; U.S. Pat. No. 4,688,223, issued Aug. 18, 1987, entitled "Weighted Random Pattern Testing Apparatus And Method", to Motika et al.; U.S. Pat. No. 4,698,830, issued Oct. 6, 1987, entitled "Shift Register Latch Arrangement For Enhanced Testability In Differential Cascode Voltage Switch Circuit", to Barzilai et al.; U.S. Pat. No. 4,745,355, issued May 17, 1988, entitled "Weighted Random Pattern Testing Apparatus And Method", to Eichelberger et al.; U.S. Pat. No. 4,801,870, issued Jan. 31, 1989, entitled "Weighted Random Pattern Testing Apparatus And Method", to Eichelberger et al.; U.S. Pat. No. 5,042,034, issued Aug. 20, 1991, entitled "By-Pass Boundary Scan Design" to Correale, Jr. et al.; and U.S. Pat. No. 5,150,366, issued Sep. 22, 1992, entitled "Reduced Delay Circuits For Shift Register Latch Scan Strings", to Bardell, Jr. et al.

The following two non-commonly assigned U.S. Patents are also of interest: U.S. Pat. No. 4,912,395, issued Mar. 27, 1990, entitled "Testable LSI Device Incorporating Latch/Shift Registers and Method of Testing Same", to Sato et al; and U.S. Pat. No. 5,130,988, issued Jul. 14, 1992, entitled "Software Verification by Fault Insertion", to Wilcox et al.

OBJECTS OF THIS INVENTION

It is one object of this invention to provide an enhanced set of test patterns for use during a delay test.

It is another object of this invention to provide circuits and methods for generating an enhanced set of second vector patterns for a skewed-load delay test.

It is a further object of this invention to provide circuits and methods for generating an enhanced set of second vector patterns for a broad-side delay test.

It is still one further object of this invention to provide an integrated circuit that includes at least one block of logic, and also circuitry for testing the logic in accordance with this invention.

SUMMARY OF THE INVENTION

The foregoing and other problems are overcome and the objects of the invention are realized by circuitry and methods for performing delay tests. More particularly, a logic circuit includes at least one block of logic having a plurality of input nodes and at least one output node. The logic circuit further includes delay test circuitry that is coupled to the plurality of input nodes and to the at least one output node.

In a skewed-load embodiment the delay test circuitry comprises a scan-chain register having a plurality of outputs coupled to the plurality of input nodes through a plurality of exclusive-OR (XOR) gates for establishing at least first and second multi-bit test vectors at the plurality of input nodes. The plurality of XOR gates each have an output for establishing a logic state of one bit of the second test vector at one of the plurality of input nodes.

In a broad-side embodiment the delay test circuitry comprises a scan-chain register having a plurality of outputs coupled to the plurality of input nodes, and a plurality of output nodes of the logic circuit are coupled to inputs of the scan-chain register through a plurality of XOR gates. In this manner there is established at least first and second multi-bit test vectors at the plurality of input nodes. The plurality of XOR gates each have an output for establishing a logic state of one bit of the second test vector, via the scan-chain register, at one of the plurality of input nodes.

In the skewed-load test, the XOR gates overcome the one bit shift dependency problem, while in the broad-side test and in a STUMPS-type of test environment the XOR gates, in combination with a source or sources of random logic states, are used to introduce second vectors having optimal probabilities for launching transitions. STUMPS is an acronym for Self-Test Using a MISR and a Parallel Shift-register Sequence generator, where MISR stands for Multiple Input Signature Register.

More particularly, in the skewed-load test embodiment of this invention a first set of the XOR gates have a first input coupled to an output of the scan-chain register, a second input coupled to a first control signal line, and an output coupled to predetermined ones of the input nodes. A second set of the XOR gates have a first input coupled to an output of the scan-chain register, a second input coupled to a second control signal line, and an output coupled to other ones of the input nodes. For a first logic state appearing on either of the control signal lines, a logic state of the output of the scan-chain register is coupled to the input node, and for a second logic state appearing on either of the control signal lines, an inverse of the logic state of the output of the scan-chain register is coupled to the input node.

In a STUMPS-architecture embodiment of this invention, a first set of XOR gates have a first input coupled to an output of the scan-chain register, a second input coupled to an output of a first source of random logic states, and an output coupled to one of the input nodes. A second set of XOR gates have a first input coupled to an output of the scan-chain register, a second input coupled to an output of a second source of random logic states, and an output coupled to one of the input nodes.

In the broad-side delay test embodiment of this invention the plurality of XOR gates have a first input coupled to one of the output nodes, a second input that is switchably coupled to an output of a source of random logic states, and an output coupled to an input of a stage of the scan-chain register.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1A:
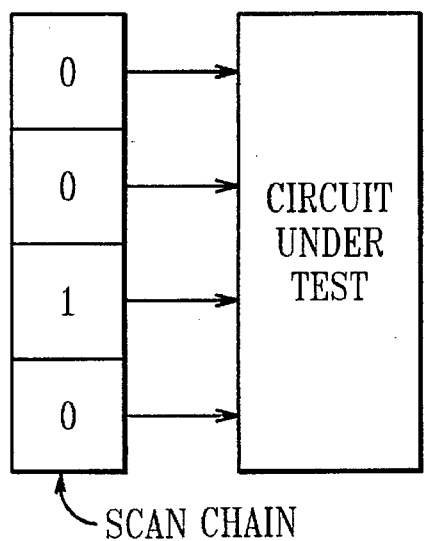
FIGS. 1A and 1B are depictions of prior art skewed-load delay test circuitry that are useful in understanding one problem that is solved by this invention.
Figure 1B:
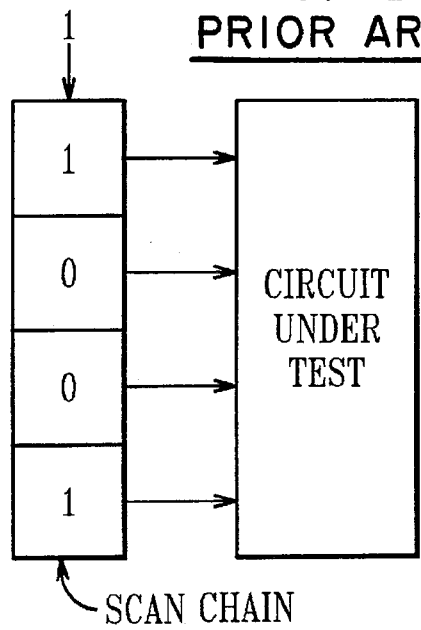
Figure 2A:
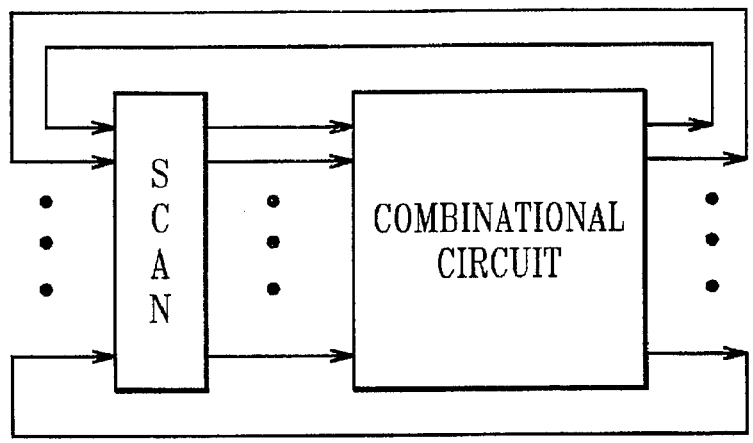
FIGS. 2A and 2B are depictions of prior art broad-side delay test circuitry that are useful in understanding a second problem that is solved by this invention.
Figure 2B:
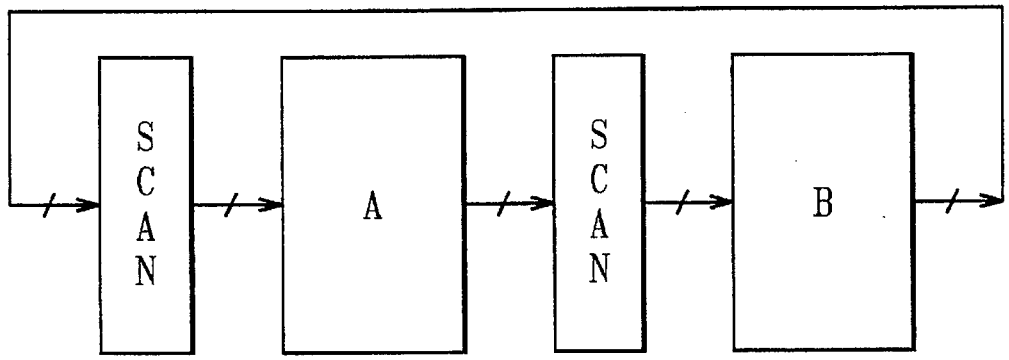
Figure 3:
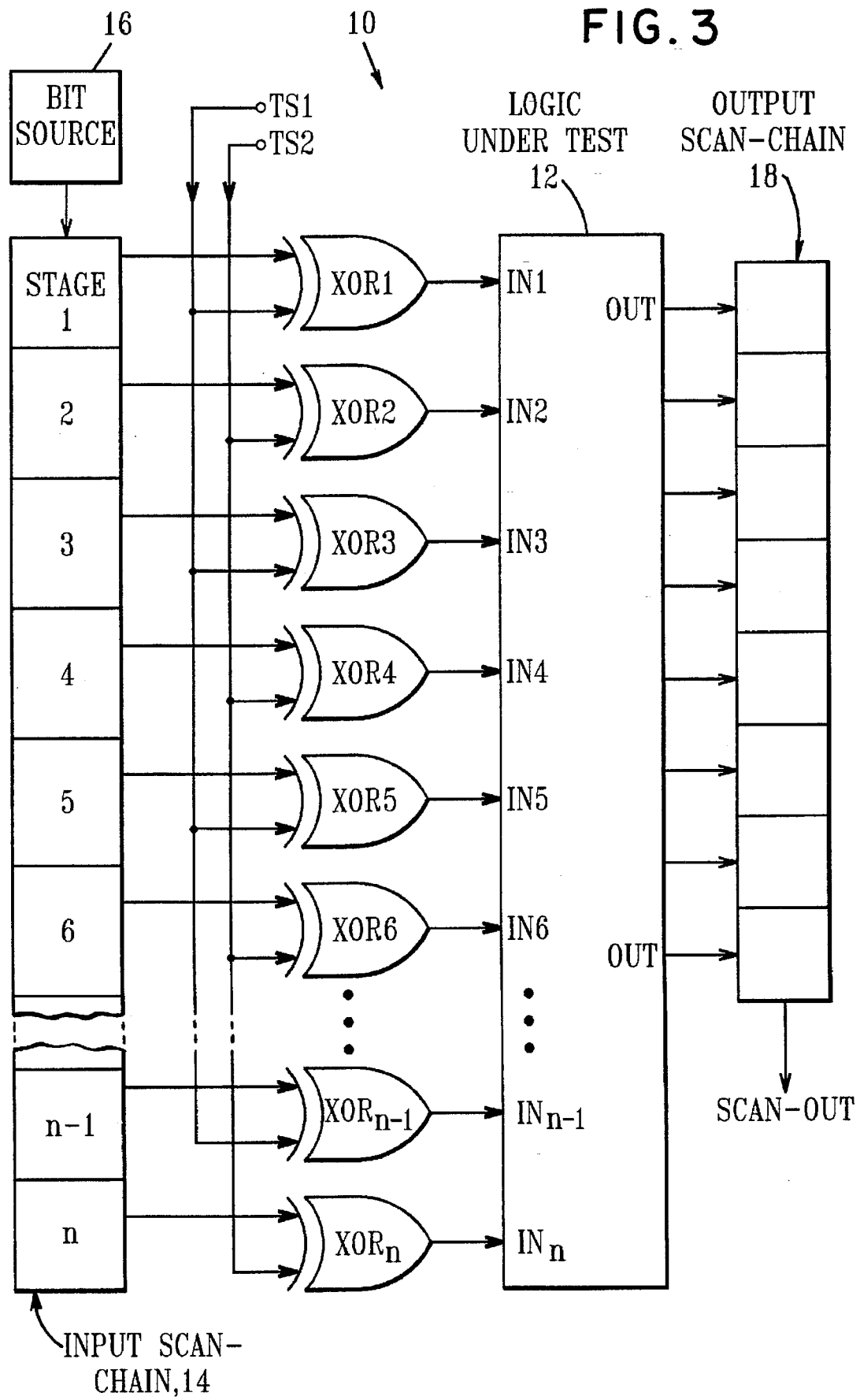
FIG. 3 is a block diagram of a circuit arrangement in accordance with a first embodiment of this invention which pertains to a skewed-load delay test.

FIG. 3 depicts an exemplary circuit arrangement in accordance with a first embodiment of this invention. This embodiment is directed specifically to the above described skewed-load delay test. A logic block 12 comprises a portion of an integrated circuit 10. The logic block 12 contains combinational logic to be tested and includes a plurality of input nodes and a plurality of output nodes. An input scan-chain 14 is connected to a bit source 16 and receives test vectors therefrom. The scan-chain 14 includes a number of serially connected stages (stage 1-stage n) each of which has an output for coupling to the input nodes of the logic block 12. Also provided is an output scan-chain 18 which has a plurality of stages, individual ones of which receive an input from one of the output nodes of the logic block 12. During a delay transition test the input scan-chain 14 is clocked to load the initializing vector V1, and is then clocked to perform the one bit shift of the initializing vector to form the vector V2. The application of the vector V2 launches one or more circuit transitions through the logic block 12. The output scan-chain 18 is then clocked at a predetermined time to latch the circuit response appearing on the output nodes. The content of the output scan-chain 18 is subsequently extracted through a scan-out port.

In accordance with this embodiment of the invention, the input scan-chain 14 is modified so as to insert a plurality of exclusive-OR (XOR) gates between the outputs of the scan-chain 14 and corresponding input nodes of the logic block 12. As was described previously, a factor limiting the fault coverage of a transition test is the shift dependency between adjacent stages of the scan-chain 14 during the skewed-load test.

This shift dependency limitation is overcome if, by example, every odd stage (1,3,5 . . . , etc.) of the scan-chain 14 is connected to a first input of a first set of XOR gates (XOR1, XOR3, XOR5 . . . , etc.) and if every even stage (2,4,6 . . . , etc.) of the scan-chain 14 is connected to a first input of a second set of XOR gates (XOR2, XOR4, XOR6 . . . , etc.). A second input of each XOR gate of the first set is connected to a first controlling signal line, referred to herein as a Test Signal (TS1). Likewise, a second input of each XOR gate of the second set is connected to a second controlling signal line, referred to herein as a Test Signal (TS2).

By example, without the XOR1 and XOR2 gates in place (or with the XOR gates when TS1=0 and TS2=0), only six out of the possible 12 transitions can be generated at the input nodes IN1 and IN2. These six possible transitions are:

00 to 10;
01 to 10;
01 to 00;
10 to 01;
10 to 11; and
11 to 01.

The six missing transitions, however, can be generated when TS2=1 as follows:

00 to 01;
00 to 11;
01 to 11;
10 to 00;
11 to 00; and
11 to 10.

For the first three cases, the zero that is shifted from Stage 1 to Stage 2, in combination with the one at the second input of the XOR2, causes the output of XOR2 (and the input node IN2) to be a one. For the last three cases the one that is shifted from Stage 1 to Stage 2, in combination with the one at the second input of the XOR2, causes the output of XOR2 (and the input node IN2) to be a zero. As a result, for each of these six cases the result is the effective inversion of the logic state of the bit that is shifted from Stage 1 to Stage 2.

That is, by setting the TS signal lines to a controlling level (a one), and by pre-selecting the appropriate level for the bit that is shifted into the scan-chain stage that feeds the XOR, the logic level at input node IN2 is forced to the desired state. In accordance with the use of the teaching of this invention, the full repertoire of 12 possible transition vectors V2 can be asserted at the input nodes IN1 and IN2 of the logic block 12.

In like manner, by setting the TS1 and TS2 in concert with a one bit shift of the scan-chain register 14, any combination of second vectors can be achieved at the input nodes, such as between IN2 and IN3, as a function of logic states of the bits of the initializing vector V1.

This transition test pattern enhancement can be achieved independently of the scan direction.

Figure 4:
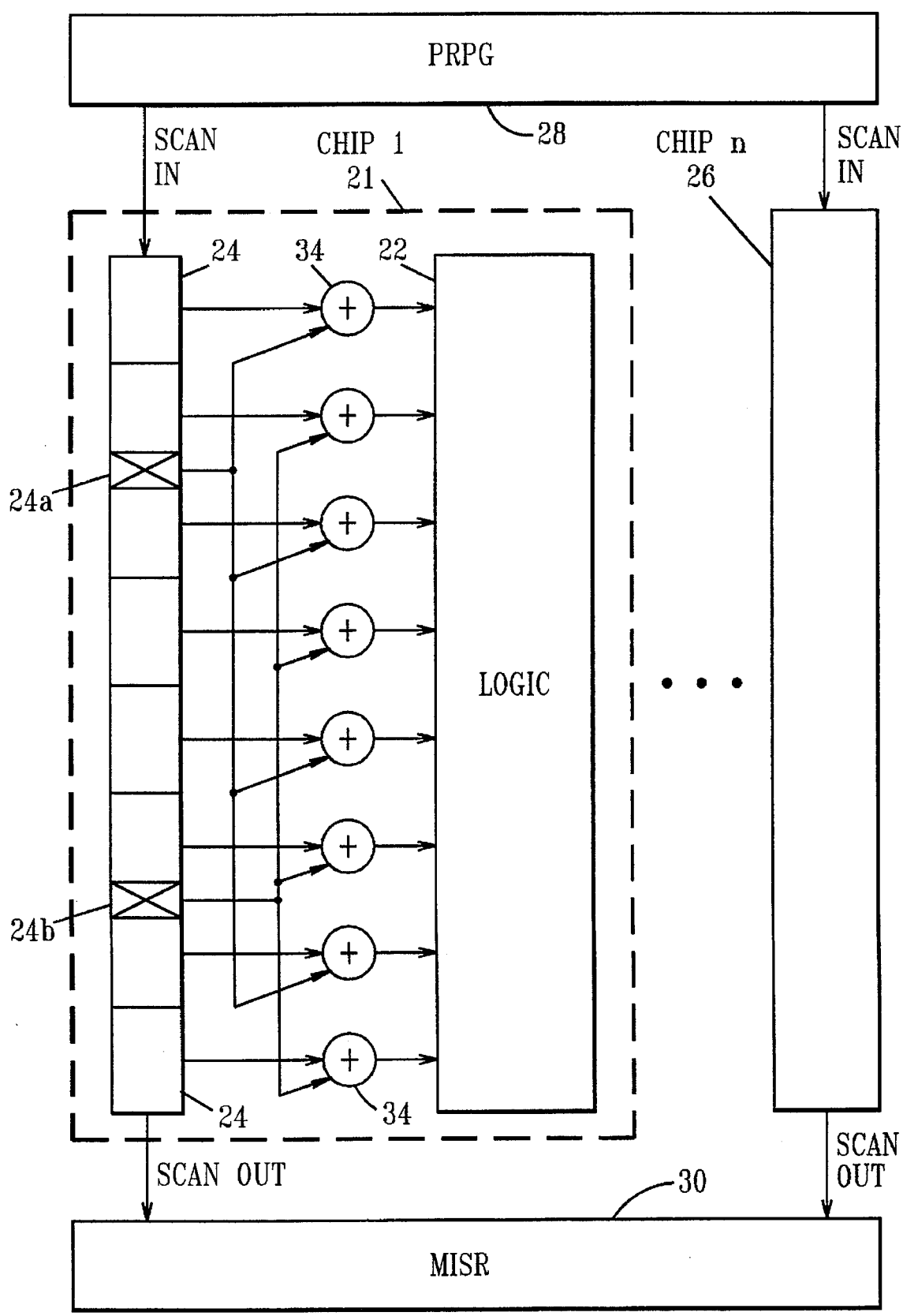
FIG. 4 is a block diagram of a circuit arrangement in accordance with a second embodiment of this invention which pertains to a delay test in a STUMPS architecture system.

FIG. 4 is a block diagram of a STUMPS-type architecture multiple-chip board, card, module or system 20 that benefits from the teaching of this invention. In FIG. 4 the PRPG 28 is a Pseudo-Random Pattern Generator that is functionally equivalent to the parallel shift-register sequence generator.

For a further understanding of the STUMPS test approach reference can be had to pps. 285–289 of a book by P. Bardell, W. McAnney, and the J. Savir, "Built In Test For VLSI: pseudorandom techniques", John Wiley, 1987. Reference can also be had to the above-mentioned commonly assigned U.S. Pat. No. 4,503,537, issued Mar. 5, 1985, entitled "Parallel Path Self-Testing System", to W. H. McAnney, the disclosure of which is incorporated by reference herein in its entirety.

In FIG. 4 a logic block 22 within a chip 21 has input nodes connected to a scan-chain 24. A further chip 26 (chip n) is illustrated to show that the PRPG 28 and the MISR 30 are coupled in common to the scan input and output, respectively, of a plurality of chips of the multi-chip system 20.

During use the scan-chain 24 is loaded with pseudorandom patterns from the PRPG 28. After being loaded, the shift clocks are cycled to cause a one-bit shift of the scan-chain 24, as in the skewed-load delay test described above, and to capture the test results back into the scan-chain of similar kind as 24 (these scan chains are not shown in FIG. 4). The results are then scanned out of the MISR 30. This process can be repeated any number of times, with each test modifying a test signature that is accumulated within the MISR 30. After the last test, a pass or fail indication is obtained by comparing the resultant signature within the MISR 30 with a predetermined signature.

The teaching of this invention is applied to the STUMPS test architecture of FIG. 4 by employing a plurality of XOR gates (shown collectively as XOR gates 34) in combination with selected ones of the scan chain 24 stages 24a and 24b (indicated by cross-hatching). These selected stages 24a and 24b function as random bit sources as the bits are shifted through the scan-chain 24. The output of the first selected scan-chain stage 24a is applied to a first input of a first set of the XOR gates. The second input of each of the first set of XOR gates is applied from predetermined ones of the stages of the scan-chain 24, more particularly the odd stages (1,3,5 . . . , etc.). The output of the second selected scan-chain stage 24b is applied to a first input of a second set of the XOR gates. The second input of each of the second set of XOR gates is applied from predetermined ones of the stages of the scan-chain 24, more particularly the even stages (2,4,6 . . . , etc.).

It is also within the scope of this invention to employ only certain predetermined scan-chain stages, where it has been determined that the pseudorandom sequences do not provide a sufficient number or variability of local patterns so as to thoroughly exercise the cone of logic whose inputs are connected to the predetermined stage, and possibly, one or more adjacent stages.

The introduction of the random bit sources 24a and 24b, in combination with the logical states within the scan-chain 24, enables each of the XOR gates 34 to output sequences of logical states that would not normally be achieved through the use of only the pseudorandom pattern supplied by the PRPG 28.

Figure 5:
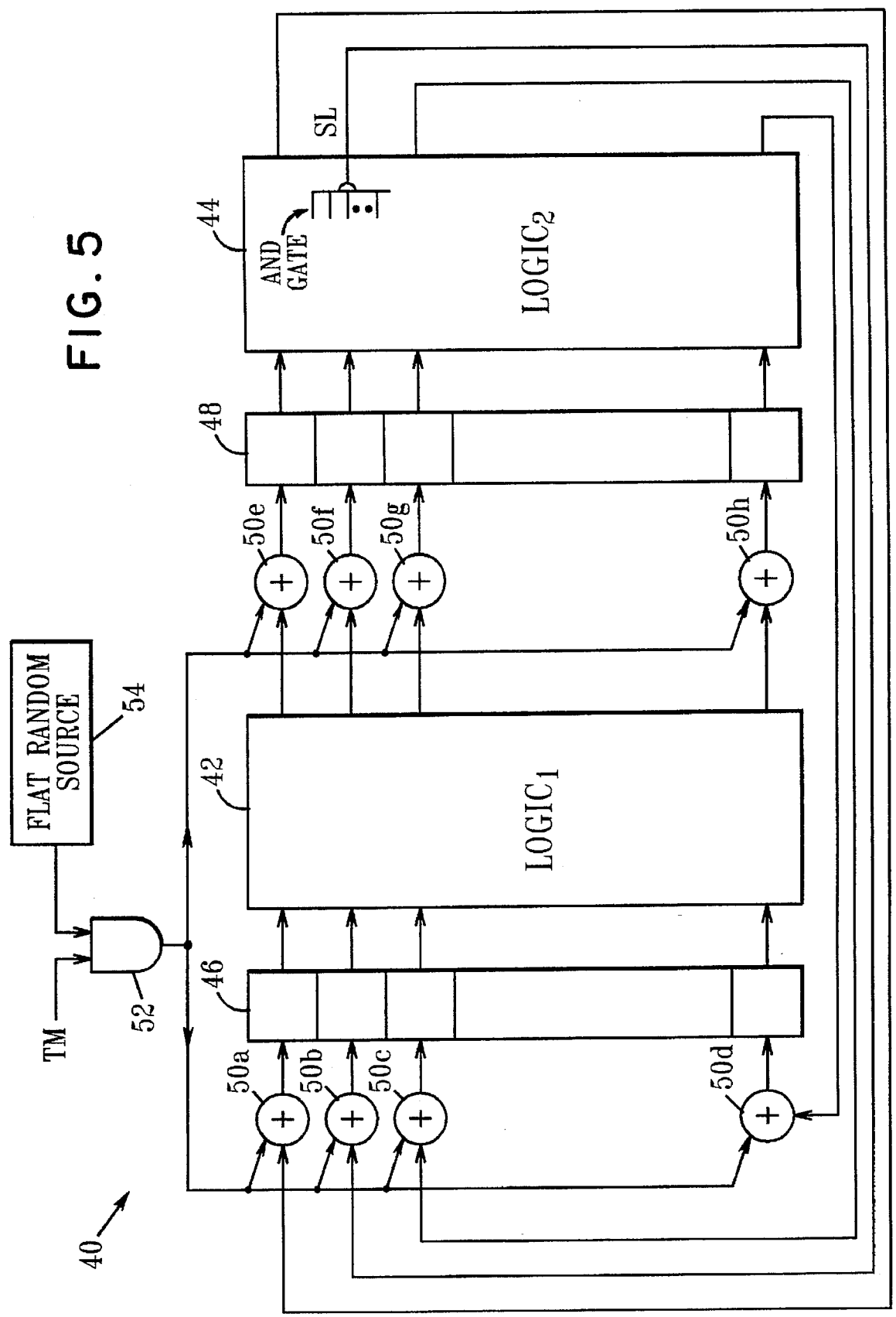
FIG. 5 is a block diagram of a circuit arrangement in accordance with a third embodiment of this invention which pertains to a broad-side delay test.

Reference is now made to FIG. 5 for a description of an integrated circuit 40 that includes a broad-side test capability in accordance with this invention. The integrated circuit 40 includes, by example, two combinational logic blocks 42 and 44, associated scan-chains 46 and 48 and, in accordance with this invention, a plurality of XOR elements 50a–50h. Individual ones of the XOR elements 50 are associated with an input of a stage of each of the scan-chains 46 and 48. In accordance with this embodiment of the invention, the output of a flat random source 54 is applied to a first input of each of the XOR elements 50a–50h through a switch, embodied herein as an AND gate 52. The AND gate 52 is enabled to pass the output of the flat random source 54 when a Test Mode (TM) input is asserted (a logic one), otherwise the output of the AND gate 52 is forced to a zero.

A flat random source is defined herein to be source that is capable of generating a logic one or a logic zero output state with equal, or approximately equal, probabilities.

In operation, and assuming first that TM is deasserted (a logic zero), the initializing vectors V1 for both of the logic blocks 42 and 44 are shifted into the scan-chains 46 and 48, respectively. The resulting responses from the logic blocks 42 and 44 are output, via the second input and the output of each of the XOR elements 50a–50h, to parallel load inputs to the scan-chains 48 and 46, respectively. This results in the creation of second vectors (V2) that launch delay test transitions back through the logic blocks 42 and 44. The resulting output responses from logic block 42 and logic block 44 are then latched into the scan-chains 48 and 46, respectively, which may then be scanned out and examined. In that TM is a zero, and the output of the AND 52 is forced to a zero, the XOR elements 50a–50h are transparent, except for a small propagation delay, to the outputs of the logic blocks 42 and 44. As a result, the circuitry functions in a conventional broad-side delay test fashion.

However, when TM is asserted the output of the flat random source 54 is applied to the first input of each of the XOR elements 50a–50h.

The application of the output of the flat random source 54 overcomes the problem of the second vector (V2) of the delay test pair when it is experiencing extreme signal probability values on certain signal lines. This problem is due to the combinational logic skew that occurs when a vector is passed through a combinational network. The extreme signal probabilities (either close to 0, or close to 1) have a dramatic affect on the attainable delay fault coverage.

As an example, assume that an n-bit AND gate (where n is an arbitrarily large number such as 10) feeds an output signal line (SL) of the second logic block 44 in FIG. 5. The n-inputs are fed from various other unillustrated logical elements within the logic block 46. In order to assert a logic one on SL, each of the n-inputs of the AND gate must simultaneously be a one. It can be appreciated that a very large number of random patterns may need to be applied to the input nodes of the second logic block 44 before all of the n inputs of the AND gate assume a logic one condition. That is, the probability of the signal line SL attaining a logic one state is severely skewed towards a value of zero. If SL is required to be logic one in order to launch a desired transition at the input of the first logic block 42, then a considerable amount of test time can be required to establish the required V2 at the input to the first logic block 42. To solve this problem, the use of this invention forces a signal probability of approximately 0.5 on each line entering the scan-chain registers 46 and 48.

FIG. 5 shows a presently preferred embodiment of a scan-based network (by example an LSSD network) having the two combinational circuits 42 and 44. The XOR gates 50a–50h are inserted between the outputs of the combinational circuits 42 and 44 and their scan chain destinations. The TM signal controls the operation of all the XOR gates 50a–50h. When TM=0, the circuit functions in a conventional broad-side delay test fashion. However, when TM=1 the XOR gates 50a–50h are fed from the flat random source 54. In this mode, the flat random source 54 forces the signal entering the scan-chains 46 and 48 to have a signal probability of 0.5, regardless of the signal probability value that are output from the combinational circuits 42 and 44.

To explain in greater detail, let p1 and p2 be the two signal probabilities entering one of the XOR gates 50a–50h. The signal probability at an XOR gate output is given by the expression:

$$p = p1 + p2 - 2(p1 p2).$$

If p2=0.5, then p=0.5, which is independent of the value of p1.

The flat random source 54 may be provided from a scan-chain stage, such as an LSSD stage, in the manner illustrated for the random bit sources 24a and 24b of the FIG. 4 embodiment, or from any other source that is known to output random bit values during the test. By example, and referring to the STUMPS test described previously with respect to FIG. 4, the flat random source 54 may be derived from any existing scan-chain stage, such as a Shift Register Latch (SRL) in an LSSD embodiment, since in the test mode the scan stage has flat random values.

In the various embodiments of the invention described above it is assumed that conventional fault modelling and test pattern generation systems can be employed to derive test patterns for loading the scan-chain registers.

Furthermore, in certain embodiments of this invention, such as those illustrated in FIGS. 3 and 4, it may be desirable to first perform fault modelling without the XOR gates. For those areas where it is determined that the addition of the XOR gates will improve the fault coverage, then one or more XOR gates are added as appropriate. One consideration is the amount of "slack" in a given circuit path. That is, it is desirable to add an XOR gate to a circuit path so long as the incremental propagation delay represented by the XOR gate (e.g., 10 picoseconds), and the associated wiring, does not make the overall path propagation time substantially equal to or greater than the maximum allowable propagation time.

It should be realized that the teaching of this invention is applicable to all known types scan-chain networks including, but not limited to, the above-mentioned LSSD, and also random access scans, scan pass methods, scan/set logic, different types of boundary scan architectures, and variations of these scan-based techniques.

Thus, while this invention has been particularly shown and described with respect to preferred embodiments thereof, it will be understood by those skilled in the art that changes in form and details may be made therein without departing from the scope and spirit of the invention.

Having thus described my invention, what I claim as new, and desire to secure by Letters Patent is:

1. A logic circuit comprising at least one block of logic having a plurality of input nodes and at least one output node, said logic circuit further comprising: delay fault test circuitry for testing said at least one block of logic, said delay fault test circuitry being coupled to said plurality of input nodes and to said at least one output node, said delay fault test circuitry comprising a scan-chain register having a plurality of outputs coupled to said plurality of input nodes for sequentially establishing at said plurality of input nodes at least a first multi-bit test vector for generating initialization logic states in said at least one block of logic and a second multi-bit test vector for provoking logical transitions at potential fault sites in said at least one block of logic, said delay fault test circuitry further comprising a plurality of XOR gates that are coupled to said scan-chain register, said plurality of XOR gates each having an output for establishing a logic state of one bit of said second test vector at one of said plurality of input nodes and operating to reduce or eliminate at least one of (a) a one bit shift dependency between said first and second test vectors and (b) a skew in probability values that results from an application of the first test vector to said at least one block of logic.

2. A logic circuit as set forth in claim 1 wherein said plurality of XOR gates are organized as at least two sets of XOR gates, wherein XOR gates of the first set each have a first input coupled to an output of said scan-chain register, a second input coupled to a first control signal line, and an output coupled to one of said input nodes, wherein XOR gates of the second set each have a first input coupled to an output of said scan-chain register, a second input coupled to a second control signal line, and an output coupled to one of said input nodes, wherein for a first logic state appearing on said control signal lines a logic state of the output of the scan-chain register is coupled to said input nodes, and wherein for a second logic state appearing on said control signal lines an inverse of the logic state of the output of the scan-chain register is coupled to said input nodes.

3. A logic circuit as set forth in claim 1 wherein said plurality of XOR gates each have a first input coupled to an output of said scan-chain register, a second input coupled to an output of a source of random logic states, and an output coupled to one of said input nodes.

4. A logic circuit as set forth in claim 1 wherein said plurality of XOR gates each have a first input coupled to one of said output nodes, a second input coupled to an output of a source of random logic states, and an output coupled to an input of a stage of said scan-chain register.

5. A logic circuit as set forth in claim 4 and further comprising switch means coupled between said source and said second inputs, where for a first state of said switch means a logical state of said output nodes is coupled through said XOR gates to said stages of said scan-chain register, and wherein for a second state of said switch means said output of said source is coupled through said XOR gates to said inputs of said stages of said scan-chain register.

6. An integrated circuit comprising at least one block of logic having a plurality of input nodes and at least one output node, said integrated circuit further comprising:

skewed-load delay fault test circuitry for testing said at least one block of logic, said skewed-load delay fault test circuitry being coupled to said plurality of input nodes for sequentially establishing at said plurality of input nodes at least a first multi-bit test vector for generating initialization logic states in said at least one block of logic and a second multi-bit test vector for provoking logical transitions at potential fault sites in said at least one block of logic, said skewed-load delay fault test circuitry including a scan-chain register and a plurality of XOR gates, wherein said plurality of XOR gates are organized as at least two sets of XOR gates, wherein XOR gates of the first set each have a first input coupled to an output of said scan-chain register, a second input coupled to a first control signal line, and an output coupled to one of said input nodes, wherein XOR gates of the second set each have a first input coupled to an output of said scan-chain register, a second input coupled to a second control signal line, and an output coupled to one of said input nodes, wherein for a first logic state appearing on said control signal lines a logic state of the output of the scan-chain register is coupled to said input nodes, and wherein for a second logic state appearing on said control signal lines an inverse of the logic state of the output of the scan-chain register is coupled to said input nodes, wherein said first inputs of said first set of XOR gates are coupled to non-adjacent stages of said scan-chain register, and wherein said first inputs of said second set of XOR gates are coupled to non-adjacent stages of said scan-chain register.

7. A logic circuit as set forth in claim 6 wherein there are n input nodes, and wherein there are n XOR gates.

8. A multi-chip system comprised of a plurality of integrated circuits, wherein at least one of said integrated circuits comprises at least one block of logic having a plurality of input nodes and at least one output node, said multi-chip system further comprising:

delay fault test circuitry internal to said at least one of said integrated circuits for testing said at least one block of logic,. said delay fault test circuitry being coupled to said plurality of input nodes for sequentially establishing at said plurality of input nodes at least a first multi-bit test vector for generating initialization logic states in said at least one block of logic and a second multi-bit test vector for provoking logical transitions at potential fault sites in said at least one block of logic, said delay fault test circuitry further being coupled to said at least one output node, said delay fault test circuitry comprising a scan-chain register and a plurality of XOR gates, wherein said plurality of XOR gates are organized as at least two sets of XOR gates, wherein XOR gates of the first set each have a first input coupled to an output of said scan-chain register, a second input coupled to an output of a first random bit source, and an output coupled to one of said input nodes, wherein XOR gates of the second set each have a first input coupled to an output of said scan-chain register, a second input coupled to an output of a second random bit source, and an output coupled to other ones of said input nodes;

pseudorandom bit source means having an output coupled to a scan-in port of said scan-chain register; and signature register means coupled to a scan-out port of said scan-chain register.

9. An integrated circuit comprising at least one block of logic having a plurality of input nodes and a plurality of output nodes, said integrated circuit further comprising:

broad-side delay fault test circuitry for testing said at least block of logic, said broad-side delay fault test circuitry being coupled to said plurality of input nodes for sequentially establishing at said plurality of input nodes at least a first multi-bit test vector for generating initialization logic states in said at least one block of logic and a second multi-bit test vector for provoking logical transitions at potential fault sites in said at least one block of logic, said broad-side delay fault test circuitry further being coupled to said plurality of output nodes, said broad-side delay fault test circuitry comprising, a multi-stage scan-chain register having a plurality of outputs individual ones of which are coupled to one of said input nodes; and a plurality of XOR gates each having a first input coupled to one of said plurality of output nodes, a second input coupled to an output of a source of random logic states, and an output coupled to a stage of said scan-chain register.

10. An integrated circuit as set forth in claim 9 and further comprising switch means coupled between said source and said second input of each of said XOR gates, where for a first state of said switch means a logical state of each of said output nodes is coupled through one of said XOR gates to said stage of said scan-chain register, and wherein for a second state of said switch means said output of said source is coupled through each of said XOR gates to said input of said stage of said scan-chain register.

11. An integrated circuit as set forth in claim 9 wherein there are n stages of said scan-chain register, and wherein there are n XOR gates.

12. An integrated circuit as set forth in claim 10 wherein said switch means is comprised of an AND gate, and wherein a first input of said AND gate is coupled to said output of said source, a second input of said AND gate is coupled to a control logic signal line, and wherein an output of said AND gate is coupled to said second input of each of said plurality of XOR gates.

13. A method for performing a delay fault test so as to overcome a one-bit shift dependency of a second test vector upon a first test vector, comprising the steps of:

loading the first test vector into a scan-chain register and applying outputs of the scan chain register to input nodes of a logic block under test, the step of applying including a step of generating initialization logic states within the logic block under test;

performing a one bit shift of the first test vector to generate the second test vector; and modifying at least one bit of the second test vector by Exclusive-ORing the at least one bit with a test signal and applying the second test vector having the modified at least one bit to the input nodes of the logic block under test for provoking at least one logical transition at a potential fault site in the logic block under test.

14. A method as set forth in claim 13 wherein the test signal is generated by a random bit source.

15. A method as set forth in claim 14 wherein the random bit source is a stage of the scan-chain register.

16. A method as set forth in claim 13 wherein the step of loading includes a step of operating a Parallel Shift-Register Sequence Generator.

17. A method for performing a broad-side delay fault test of at least one combinational logic block having a plurality of input nodes and a plurality of output nodes, the broad-side delay fault test being performed so as to overcome a skew in probability values appearing at the plurality of output nodes in response to an application of a first test vector to the plurality of input nodes, comprising the steps of:

loading the first test vector into a scan-chain register and applying outputs of the scan chain register to the plurality of input nodes of the combinational logic block, the step of applying including a step of generating initialization logic states within the combinational logic block;

outputting logic signals from the plurality of output nodes in response to the first test vector;

Exclusive-ORing individual ones of the logic signals with a logic signal having a predetermined probability of being in a logic one or a logic zero state, thereby generating a second test vector having adjusted probability values; and coupling the second test vector to the input nodes of the combinational logic block for provoking logical transitions at potential fault sites in the combinational logic block.

18. A method as set forth in claim 17 wherein said predetermined probability is approximately 50%.

* * * * *